United States Patent
Oh et al.

(10) Patent No.: US 9,373,813 B2
(45) Date of Patent: Jun. 21, 2016

(54) ORGANIC ELECTROLUMINESCENT DEVICE HAVING THIN FILM ENCAPSULATION STRUCTURE AND METHOD OF FABRICATING THE SAME

(71) Applicant: Samsung Display Co., Ltd., Yongin, Gyeonggi-Do (KR)

(72) Inventors: Min-Ho Oh, Yongin (KR); Yoon-Hyeung Cho, Yongin (KR); Yong-Tak Kim, Yongin (KR); So-Young Lee, Yongin (KR); Jong-Woo Kim, Yongin (KR); Ji-Young Moon, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 71 days.

(21) Appl. No.: 14/059,187

(22) Filed: Oct. 21, 2013

(65) Prior Publication Data
US 2014/0225084 A1    Aug. 14, 2014

(30) Foreign Application Priority Data
Feb. 14, 2013 (KR) .................. 10-2013-0016057

(51) Int. Cl.
| | | |
|---|---|---|
| H01L 51/52 | (2006.01) | |
| H05B 33/04 | (2006.01) | |
| H01L 27/32 | (2006.01) | |
| H01L 51/56 | (2006.01) | |

(52) U.S. Cl.
CPC ........ *H01L 51/5253* (2013.01); *H01L 27/3237* (2013.01); *H01L 51/5256* (2013.01); *H01L 51/56* (2013.01)

(58) Field of Classification Search
CPC ............ H01L 27/3237; H01L 51/5253; H01L 51/5256; H01L 51/56
See application file for complete search history.

(56) References Cited

U.S. PATENT DOCUMENTS

| | | | |
|---|---|---|---|
| 7,214,600 B2 | 5/2007 | Won et al. | |
| 7,648,925 B2 | 1/2010 | Moro et al. | |
| 2005/0214556 A1* | 9/2005 | Nishimi et al. | 428/500 |
| 2008/0167413 A1* | 7/2008 | Nishimi et al. | 524/430 |
| 2009/0202743 A1* | 8/2009 | Schaepkens et al. | 427/576 |
| 2010/0207514 A1* | 8/2010 | Tanaka et al. | 313/504 |
| 2012/0256201 A1* | 10/2012 | Lee et al. | 257/88 |
| 2012/0256202 A1 | 10/2012 | Lee et al. | |

FOREIGN PATENT DOCUMENTS

| | | |
|---|---|---|
| KR | 1020060084743 A | 7/2006 |
| KR | 1020110000818 A | 1/2011 |
| KR | 1020120115840 A | 10/2012 |

* cited by examiner

*Primary Examiner* — Donald Raleigh
(74) *Attorney, Agent, or Firm* — Robert E. Bushnell, Esq.

(57) ABSTRACT

Provided is an organic electroluminescent display device, including a substrate, an organic light-emitting device on the substrate, and an encapsulation layer formed on the organic light-emitting device and the substrate. The encapsulation layer includes an inorganic layer and a polymer organic layer alternatingly stacked with an intermediate layer formed of a first organic monomer between the inorganic layer and the polymer organic layer, and one surface of the intermediate layer is bonded to the inorganic layer through bonding sites on a surface of the inorganic layer and another surface of the intermediate layer is bonded to the organic layer by polymerization.

20 Claims, 2 Drawing Sheets

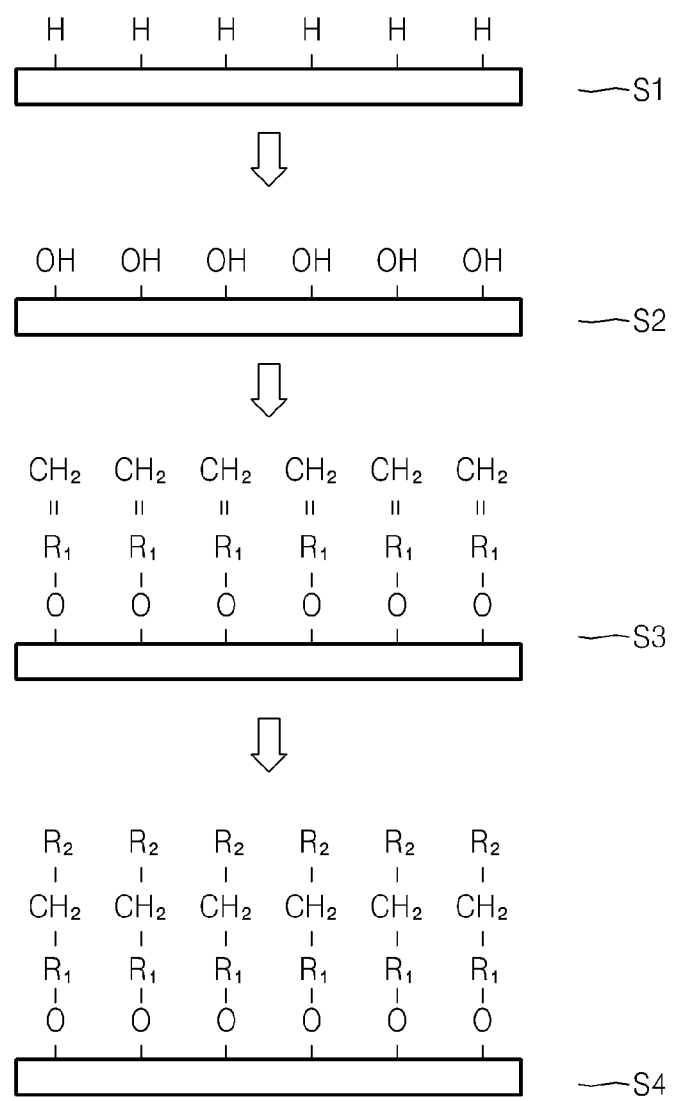

ORGANIC ELECTROLUMINESCENT DEVICE HAVING THIN FILM ENCAPSULATION STRUCTURE AND METHOD OF FABRICATING THE SAME

CLAIM OF PRIORITY

This application claims priority under 35 U.S.C. §119 of Korean Patent Application No. 10-2013-0016057, filed on Feb. 14, 2013, in the Korean Intellectual Property Office, the disclosure of which is incorporated herein in its entirety by reference.

BACKGROUND OF THE INVENTION

1. Field of the Invention

The present invention generally relates to an organic electroluminescent device having a thin film encapsulation structure, and more particularly, to an organic electroluminescent device having a thin film encapsulation structure, in which an inorganic layer and an organic layer are stacked, and a method of fabricating the same.

2. Description of the Related Art

Encapsulation technology of an organic light-emitting device may include substrate bonding technology for bonding an encapsulation substrate and a substrate having an organic light-emitting device formed thereon to each other, and a thin film encapsulation technology for forming an encapsulation layer in the form of a thin film without an encapsulation substrate. The bonding of the encapsulation substrate and the substrate having an organic light-emitting device formed thereon is performed by using an inorganic frit or an organic adhesive. An inorganic layer, such as AlOx, SiNx, SiOx, and SiON, on a panel may be used for thin film encapsulation.

An inorganic layer for thin film encapsulation is thin, but a density thereof is high, and thus, the inorganic layer for thin film encapsulation may have barrier characteristics with respect to moisture and oxygen. However, since an inorganic layer has brittle characteristics, mechanical properties thereof under stress may be poor. In particular, a plurality of particles may exist on a substrate during a process of fabricating an organic light-emitting device, and an inorganic layer disposed on the particles may be significantly affected by stress, and thus, the barrier characteristics of the inorganic layer may be degraded.

Therefore, a structure is introduced for planarizing an irregular surface, such as particles, by introducing an organic layer between the inorganic layers as well as relieving the stress of the inorganic layer. Acryl, silicone, and epoxy are used as the organic layer.

In general, thermal stability must be maintained at about 100° C. for the reliability of the organic light-emitting device. However, a phenomenon of peeling-off of an interface between the inorganic layer and the organic layer may occur during exposure at a high temperature for a prolonged period of time. For example, since strong chemical bonding may be difficult to be formed in the case where an acryl layer is deposited on a SiNx layer deposited through a plasma enhanced chemical vapor deposition (PECVD) process, an interface between the SiNx layer and the acryl layer may be peeled off due to heat.

SUMMARY OF THE INVENTION

The present invention provides an organic light-emitting device having a stable thin film encapsulation structure by improving interfacial adhesion between an inorganic layer and an organic layer, and a method of fabricating the same.

According to an aspect of the present invention, there is provided an organic electroluminescent display device including a substrate, an organic light-emitting device on the substrate, and an encapsulation layer formed on the organic light-emitting device and the substrate. The encapsulation layer includes an inorganic layer and a polymer organic layer alternatingly stacked with an intermediate layer formed of a first organic monomer between the inorganic layer and the polymer organic layer, and one surface of the intermediate layer is bonded to the inorganic layer through bonding sites on a surface of the inorganic layer and another surface of the intermediate layer is bonded to the organic layer by polymerization.

According to another aspect of the present invention, there is provided a method of fabricating an organic electroluminescent display device including providing a substrate, forming an organic light-emitting device on the substrate, and forming an encapsulation layer including an inorganic layer and a polymer organic layer alternatingly stacked with an intermediate layer formed of a first organic monomer between the inorganic layer and the polymer organic layer on the organic light-emitting device and the substrate. One surface of the intermediate layer is bonded to the inorganic layer through bonding sites on a surface of the inorganic layer and another surface of the intermediate layer is bonded to the organic layer by polymerization.

BRIEF DESCRIPTION OF THE DRAWINGS

The above and other features and advantages of the present invention will become more apparent by describing in detail exemplary embodiments thereof with reference to the attached drawings in which:

FIG. 2 is a diagram conceptually illustrating a process in which an intermediate layer forms a bond between an inorganic layer and an organic layer.

DETAILED DESCRIPTION OF THE INVENTION

Figure 1:
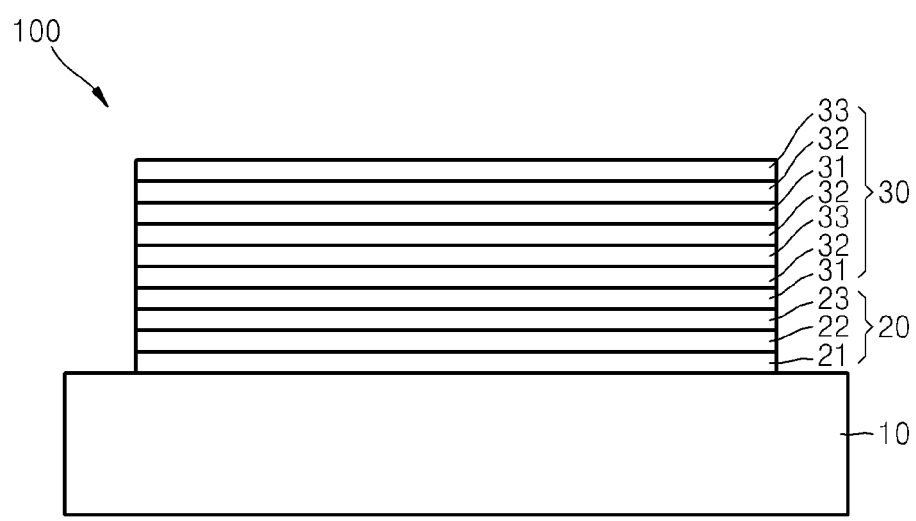
FIG. 1 is a cross-sectional view schematically illustrating an organic electroluminescent display device constructed as an embodiment according to the principles of the present invention.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions are exaggerated for clarity. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view schematically illustrating an organic electroluminescent display device constructed as an embodiment according to the principles of the present invention.

An organic electroluminescent display device 100 constructed as an embodiment according to the principles of the present invention includes a substrate 10, an organic light-emitting device 20 on the substrate 10, and an encapsulation layer 30 formed on the substrate 10 to cover the organic light-emitting device 20.

Substrates formed of various materials, such as glass, plastic, silicon, or metal, may be used as the substrate 10. A buffer layer (not shown) for preventing diffusion of impurity elements or ions and infiltration of moisture from the substrate 10 to a thin film transistor (TFT) or the organic light-emitting device 20 on the substrate 10 and for planarizing a surface of the substrate 10 may be formed on a top surface of the substrate 10. Also, a TFT (not shown), as a circuit for driving the organic light-emitting device 20, is formed on the substrate 10.

The organic light-emitting device 20 includes a first electrode 21, a second electrode 23, and an organic layer 22 between the first electrode 21 and the second electrode 23.

The first electrode 21 may be an anode, and in this case, the first electrode 21 may be selected from materials having a high work function so as to facilitate hole injection. The first electrode 21 may be a transmissive electrode or a reflective electrode. The first electrode 21, for example, may be formed of indium tin oxide (ITO), indium zinc oxide (IZO), zinc oxide (ZnO), aluminum (Al)-doped zinc oxide (AZO), indium oxide ($In_2O_3$), or tin oxide ($SnO_2$). The first electrode 21 may also be formed as a reflective electrode by using magnesium (Mg), silver (Ag), Al, aluminum-lithium (Al—Li), calcium (Ca), Ag-ITO, Mg—In, or Mg—Ag. The first electrode 21 may have a single layer structure or a multilayer structure having two or more layers. For example, the first electrode 21 may have a three-layer structure of ITO/Ag/ITO, but the first electrode 21 is not limited thereto.

The organic layer 22 in the organic light-emitting device 20 includes at least an emissive layer (EML) and in addition, may further include layers for hole injection and transport, electron injection and transport, and charge balance.

The second electrode 23 may be a cathode, and in this case, a metal, an alloy, an electrically conductive compound, or a mixture of two or more thereof having a low work function may be used as the second electrode 23. The second electrode 23, for example, may be included as a transparent electrode or a reflective electrode. In the case that the second electrode 23 is included as a transparent electrode, the second electrode 23 may include a thin film formed of Li, Ca, Al, Mg, Mg—In, Mg—Ag, LiF—Al, LiF—Ca, or a compound thereof and an auxiliary electrode formed of a transparent conductive material, such as ITO, IZO, ZnO, or $In_2O_3$, disposed thereon. Alternatively, in the case that the second electrode 23 is included as a reflective electrode, the second electrode 23 may be formed of Li, Ca, Al, Mg, Mg—In, Mg—Ag, LiF—Al, LiF—Ca, or a compound thereof.

The encapsulation layer 30 is composed of an inorganic layer 31 and an organic layer 33 alternatingly stacked with an intermediate layer 32 between the inorganic layer 31 and the organic layer 33.

The inorganic layer 31, for example, may be formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide. An optimum thickness of the inorganic layer 31 may be determined according to productivity or device characteristics. The inorganic layer 31 is thin, but a density thereof is high, and thus, the inorganic layer 31 may have barrier characteristics with respect to moisture and oxygen.

The organic layer 33 may be formed of an acryl-based resin, a methacryl-based resin, an isoprene-based resin, a vinyl-based resin, an epoxy-based resin, a urethane-based resin, a cellulose-based resin, a perylene-based resin, an imide-based resin, or a mixture of two or more thereof. An optimum thickness of the organic layer 33 may be determined according to characteristics of the inorganic layer 31, productivity, and device characteristics. The organic layer 33 may act to relieve stress of the inorganic layer 31 and planarize the inorganic layer 31.

One surface of the intermediate layer 32 is bonded to the inorganic layer 31 through bonding sites on a surface of the inorganic layer 31, and another surface of the intermediate layer 32 is boned to the organic layer 33 by polymerization. The intermediate layer 32 may be formed of a material which may be bonded to a bonding site, such as oxygen, on the surface of the inorganic layer 31 and may be bonded to the organic layer 33 by polymerization. The intermediate layer 32 may be formed of a monomer which is an organic compound including a polymerizable double bond. For example, the intermediate layer 32 may be formed of methacrylate, acrylate, or epoxy. For example, a hydroxyl or carbonyl moiety of methacrylate may be bonded to a bonding site, e.g., an oxygen or hydrogen atom, on the surface of the inorganic layer 31 and/or a carbonyl or carbon-carbon double bond moiety thereof may be bonded to the organic layer 33 by polymerization. An optimum thickness of the intermediate layer 32 may be determined according to a degree of adhesion between the inorganic layer 31 and the organic layer 33. For example, the intermediate layer 32 may be formed to a thickness of a few tens of angstrom (Å), but the thickness of the intermediate layer 32 is not limited thereto.

In the encapsulation layer 30, the pluralities of organic layers 33 and inorganic layers 31 may be alternatingly stacked and the intermediate layer 32 may be disposed between the organic layer 33 and the inorganic layer 31.

Since the intermediate layer 32 is bonded to the organic layer 33 and the inorganic layer 31, adhesion between the organic layer 33 and the inorganic layer 31 is improved, and thus, occurrence of peeling-off due to thermal stress and deformation may be prevented.

Hereinafter, a method of fabricating an organic electroluminescent display device according to an embodiment of the present invention will be described.

First, a substrate 10 is provided. Substrates formed of various materials, such as glass, plastic, silicon, or metal, may be used as the substrate 10. A buffer layer (not shown) for preventing diffusion of impurity elements or ions and infiltration of moisture from the substrate 10 to a TFT or an organic light-emitting device 20 above the substrate 10 and for planarizing a surface of the substrate 10 may be formed on a top surface of the substrate 10. Also, a TFT (not shown), as a circuit for driving the organic light-emitting device 20, is formed on the substrate 10.

The organic light-emitting device 20 electrically connected to the TFT (not shown) is formed on the substrate 10. The organic light-emitting device 20 includes a first electrode 21, a second electrode 23, and an organic layer 22 between the first electrode 21 and the second electrode 23.

The first electrode 21 may be an anode, and in this case, the first electrode 21 may be formed by selecting a material having a high work function so as to facilitate hole injection. The first electrode 21 may be a transmissive electrode or a reflective electrode. The first electrode 21, for example, may be formed of ITO, IZO, ZnO, AZO, $In_2O_3$, or $SnO_2$. The first electrode 21 may also be formed as a reflective electrode by using Mg, Ag, Al, Al—Li, Ca, Ag-ITO, Mg—In, or Mg—Ag.

The first electrode 21 may be formed as a single layer structure or a multilayer structure having two or more layers. The first electrode 21 may be formed by evaporation or sputtering.

The organic layer 22 includes at least an EML and in addition, may further include a hole injection layer (HIL), a hole transport layer (HTL), an electron transport layer (ETL), and an electron injection layer (EIL). The organic layer 22 may be formed of a low molecular weight or high molecular weight material, and may be formed by using various methods, such as a vacuum deposition method, a spin coating method, a casting method, and a Langmuir-Blodgett (LB) method.

The hole injection layer may be formed of a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4''-tris(3-methylphenylphenylamino)triphenylamine (m-MTDATA), 4,4',4''-Tris(N,N-diphenylamino)triphenylamine (TDATA), 4,4',4''-tris{N,-(2-naphthyl)-N-phenylamino}-triphenylamine (2T-NATA), poly(3,4-ethylenedioxythiophene)/poly (4-styrenesulfonate) (PEDOT/PSS), polyaniline/dodecylbenzenesulfonic acid (PANI/DBSA), polyaniline/camphor sulfonic acid (PANI/CSA), or polyaniline/poly(4-styrenesulfonate) (PANI/PSS). However, the hole injection layer is not limited thereto.

The hole transport layer may be formed of a carbazole derivative, such as N-phenylcarbazole and polyvinylcarbazole, and a triphenylamine-based material such as N,N'-bis (3-methylphenyl)-N,N'-diphenyl-[1,1-biphenyl]-4,4'-diamine (TPD), N,N'-di(1-naphthyl)-N,N'-diphenylbenzidine (NPB), or 4,4',4''-tris(N-carbazolyl)triphenylamine (TCTA). However, the hole transport layer is not limited thereto.

The electron transport layer may be formed of Alga, 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)- (1,1'-Biphenyl-4-olato)aluminum (BAlq), beryllium bis(benzoquinolin-10-olate) (Bebq$_2$), or 9,10-di(naphthalene-2-yl) anthracene (ADN). However, the electron transport layer is not limited thereto.

The electron injection layer may be formed by using a material such as LiF, NaCl, CsF, Li$_2$O, BaO, and Liq.

The emissive layer may be formed to include a host material and a dopant material.

Examples of the host may be tris-(8-quinolinolato)aluminum (Alq3), 4,4'-bis(N-carbazolyl)-1,1'-biphenyl (CBP), poly(n-vinylcabazole) (PVK), ADN, TCTA, 1,3,5-tris(N-phenylbenzimidazole-2-yl)benzene (TPBI), 3-tert-butyl-9, 10-di(naphtha-2-yl)anthracene (TBADN), distyrylarylene (DSA), E3, or 4,4'-bis(9-carbazolyl)-2,2'-dimethyl-biphenyl (CDBP). However, the host is not limited thereto.

Examples of the dopant may be Pt(II) octaethylporphine (PtOEP), tris(2-phenylisoquinoline)iridium (Ir(piq)$_3$), bis(2-(2'-benzothienyl)-pyridinato-N,C3')iridium(acetylacetonate) (Btp$_2$Ir(acac)), tris(2-phenylpyridine)iridium (Ir(ppy)$_3$), Bis(2-phenylpyridine)(Acetylacetonato)iridium (III) (Ir(ppy)$_2$(acac)), tris(2-(4-tolyl)phenylpyridine)iridium (Ir(mppy)$_3$), 10-(2-benzothiazolyl)-1,1,7,7-tetramethyl-2,3, 6,7-tetrahydro-1H,5H,11H-[1]benzopyrano[6,7,8-ij]-quinolizin-11-one (C545T), Bis[3,5-difluoro-2-(2-pyridyl)phenyl] (picolinato)iridium(III) (F$_2$Irpic), (F$_2$ppy)$_2$Ir(tmd), Ir(dfppz)$_3$, 4,4'-bis(2,2'-diphenylethen-1-yl)biphenyl (DPVBi), 4,4'-bis[4-(diphenylamino)styryl]biphenyl (DPAVBi), or 2,5,8,11-tetra-tert-butyl perylene (TBPe). However, the dopant is not limited thereto.

The second electrode 23 may be a cathode, and in this case, the second electrode 23 may be formed by using a metal, an alloy, an electrically conductive compound, or a mixture of two or more thereof having a low work function. The second electrode 23, for example, may be formed as a transparent electrode or a reflective electrode. In the case that the second electrode 23 is a transparent electrode, the second electrode 23 may be formed as a thin film formed of Li, Ca, Al, Mg, Mg—In, Mg—Ag, LiF—Al, LiF—Ca, or a compound thereof and an auxiliary electrode formed of a transparent conductive material, such as ITO, IZO, ZnO, or In$_2$O$_3$, disposed thereon. Alternatively, in the case where the second electrode 23 is a reflective electrode, the second electrode 23, for example, may be formed of Li, Ca, Al, Mg, Mg—In, Mg—Ag, LiF—Al, LiF—Ca, or a compound thereof. The second electrode 23 may be formed by sputtering or vacuum deposition.

An encapsulation layer 30 is formed on the organic light-emitting device 20.

The encapsulation layer 30 is composed of an inorganic layer 31 and an organic layer 33 alternatingly stacked with an intermediate layer 32 between the inorganic layer 31 and the organic layer 33.

The inorganic layer 31, for example, may be formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide. An optimum thickness of the inorganic layer 31 may be determined according to productivity or device characteristics. The inorganic layer 31 may be formed by using a method such as chemical vapor deposition (CVD), plasma enhanced chemical vapor deposition (PECVD), sputtering, atomic layer deposition (ALD), or thermal evaporation.

Bonding sites to be bonded to the intermediate layer 32 are formed on the surface of the inorganic layer 31. The bonding sites, for example, may be an oxygen atomic layer. For this purpose, the surface of the inorganic layer 31 may be treated with oxygen plasma or ozone plasma. An M-H bond on the surface of the inorganic layer 31 may be changed to an M-OH bond by such an oxygen or ozone plasma treatment, where M denotes silicon or metal elements of the inorganic layer 31, such as silicon, aluminum, titanium, tantalum, hafnium, zirconium, cerium, tin, or magnesium.

A preliminary intermediate layer (not shown) is formed on the surface-treated inorganic layer 31 by using an organic monomer having a polymerizable double bond, such as a vinyl group or a carbonyl group, and a photopolymerization initiator. For example, the preliminary intermediate layer (not shown) may be formed of methacrylate, acrylate, or epoxy. Examples of the photopolymerization initiator may be an acetophenone-based compound, a benzophenone-based compound, a thioxanthone-based compound, a benzoin-based compound, and a triazine-based compound. However, the preliminary intermediate layer is not limited thereto. The above materials may be used alone or by mixing two or more thereof.

The preliminary intermediate layer (not shown) may be formed by using a flash evaporation method, an inkjet process, a screen printing method, a spin coating method, or an initiated chemical vapor deposition (iCVD) method forming vapor phase radicals at high temperatures. The preliminary intermediate layer (not shown) may be formed to a thickness of a few tens of angstrom (Å), but the thickness of the preliminary intermediate layer is not limited thereto. The organic monomer of the preliminary intermediate layer (not shown) may be bonded to the bonding sites of the inorganic layer 31.

Next, a preliminary organic layer (not shown) may be formed on the preliminary intermediate layer (not shown). The preliminary organic layer (not shown), for example, may be formed of an acryl-based resin, a methacryl-based resin, an isoprene-based resin, a vinyl-based resin, an epoxy-based resin, a urethane-based resin, a cellulose-based resin, a perylene-based resin, an imide-based resin, or a mixture thereof. The preliminary organic layer (not shown), for example, may be formed by using a method such as a flash evaporation method, an inkjet process, a screen printing method, or a spin coating method.

Subsequently, the preliminary intermediate layer (not shown) and the preliminary organic layer (not shown) are cured by using ultraviolet (UV) or heat. A vinyl group of the organic monomer of the preliminary intermediate layer (not shown) is polymerized with an organic monomer of the preliminary organic layer (not shown), and the organic monomer of the preliminary organic layer (not shown) is polymerized with the organic monomer of the preliminary intermediate layer (not shown) and another monomer of an organic layer (not shown). After a curing process, the preliminary intermediate layer (not shown) becomes the intermediate layer 32 and the preliminary organic layer (not shown) becomes the organic layer 33. Thus, the intermediate layer 32 is bonded to the organic layer 33 according to such polymerizations and the organic layer 33 forms a resin layer or a polymer layer.

FIG. 2 is a diagram conceptually illustrating a process, in which an intermediate layer forms a bond between an inorganic layer and an organic layer, according to an embodiment of the present invention.

Referring to FIG. 2, in step S1, the inorganic layer having a —H bond on a surface of the inorganic layer is prepared.

Then in step S2, the —H bond on the surface of the inorganic layer is changed to a —OH bond by a surface treatment.

In step S3, a preliminary intermediate layer, in which a part $R_1$ is bonded to O of the inorganic layer and a vinyl group faces a surface, is formed on the surface-treated inorganic layer by using $R_1=CH_2$, an organic monomer having a vinyl group.

Next, in step S4, a preliminary organic layer is formed by using an organic monomer $R_2$; and then the organic monomer $R_2$ and the vinyl group of the preliminary intermediate layer are polymerized by curing to form a bond.

The intermediate layer thus is bonded to the organic layer and the inorganic layer, and as a result, adhesion between the organic layer and the inorganic layer is improved. Therefore, occurrence of peeling-off due to thermal stress may be prevented. Meanwhile, the bonding sites on the surface of the inorganic layer are not limited to only —OH and the polymerizable group of the organic monomer of the preliminary intermediate layer is not limited to only a vinyl group.

Since an intermediate layer is bonded to an organic layer and an inorganic layer, adhesion between the organic layer and the inorganic layer are improved, and thus, occurrence of peeling-off due to thermal stress may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent display device, comprising:
   a substrate;
   an organic light-emitting device formed on the substrate; and
   an encapsulation layer formed on the organic light-emitting device and the substrate, the encapsulation layer comprising at least one polymeric intermediate layer formed of a first organic monomer, at least one inorganic layer and at least one polymer organic layer formed to include a second organic monomer, the inorganic layer(s) and the polymer organic layer(s) being alternatingly stacked, a surface polymer organic layer forming a surface of the encapsulation layer, the polymeric intermediate layer being formed directly on each inorganic layer and the polymeric intermediate layer being formed directly on each polymer organic layer that is not the surface polymer organic layer, one surface of each polymeric intermediate layer being bonded to the adjacent inorganic layer and another surface of each polymeric intermediate layer being bonded to the adjacent polymer organic layer by polymerization.

2. The organic electroluminescent display device of claim 1, the first organic monomer which forms each intermediate layer comprising a polymerizable double bond.

3. The organic electroluminescent display device of claim 1, the first organic monomer which forms each intermediate layer comprising methacrylate, acrylate, or epoxy.

4. The organic electroluminescent display device of claim 1, each polymer organic layer comprising an acryl-based resin, a methacryl-based resin, an isoprene-based resin, a vinyl-based resin, an epoxy-based resin, a urethane-based resin, a cellulose-based resin, a perylene-based resin, an imide-based resin, or a mixture of two or more thereof.

5. The organic electroluminescent display device of claim 1, each inorganic layer comprising silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, or tin nitride.

6. The organic electroluminescent display device of claim 1, each inorganic layer being bonded to adjacent intermediate layer(s) through bonding sites on a surface of the inorganic layer.

7. The organic electroluminescent display device of claim 1, wherein bonding sites are derived from an —OH group.

8. The organic electroluminescent display device of claim 1, wherein the encapsulation layer comprises a plurality of the inorganic layers, a plurality of the polymer organic layers between the plurality of inorganic layers, and a plurality of the intermediate layers between the inorganic layers and the polymer organic layers.

9. The organic electroluminescent display device of claim 1, wherein the organic light-emitting device comprises a first electrode, a second electrode, and an organic emissive layer between the first electrode and the second electrode.

10. The organic electroluminescent display device of claim 1, wherein the organic light-emitting device further comprises at least one of a hole injection layer, a hole transport layer, an electron injection layer, and an electron transport layer between the first electrode and the second electrode.

11. A method of fabricating an organic electroluminescent display device, the method comprising:

providing a substrate;

forming an organic light-emitting device on the substrate; and forming an encapsulation layer on the organic light-emitting device and the substrate, the encapsulation layer including at least one inorganic layer and at least one polymer organic layer formed to include a second organic monomer, the inorganic layer(s) and the polymer organic layer(s) being alternatingly stacked with an intermediate polymer layer formed of a first organic monomer being located at each interface between an inorganic layer and a polymer organic layer, one surface of each intermediate layer being bonded to the adjacent inorganic layer through bonding sites on a surface of the inorganic layer and another surface of each intermediate layer being bonded to the adjacent polymer organic layer by polymerization.

12. The method of claim 11, the forming of the encapsulation layer comprising:

forming the at least one inorganic layer;

forming bonding sites on the surface of the at least one inorganic layer;

forming a preliminary intermediate layer on the surface of the at least one inorganic layer by using the first organic monomer, the first organic monomer being bonded to the bonding sites formed on the surface of the at least one inorganic layer, forming a preliminary organic layer on the preliminary intermediate layer by using a second organic monomer; and curing the first organic monomer and the second organic monomer to form the intermediate layer and the polymer organic layer.

13. The method of claim 12, wherein the forming of the preliminary intermediate layer is performed by flash evaporation, inkjet processing, screen printing, or spin coating.

14. The method of claim 12, wherein formation of the preliminary intermediate layer is performed by initiated chemical vapor deposition (iCVD).

15. The method of claim 14, wherein a photopolymerization initiator is used with the first organic monomer in the formation of the preliminary intermediate layer.

16. The method of claim 12, the first organic monomer comprising a polymerizable double bond and a part including the polymerizable double bond is positioned on the surface of the preliminary intermediate layer opposite to the at least one inorganic layer.

17. The method of claim 16, wherein the part including the polymerizable double bond comprises a vinyl group or a carbonyl group.

18. The method of claim 12, wherein the first organic monomer comprises methacrylate, acrylate, or epoxy.

19. The method of claim 12, wherein the preliminary organic layer is formed by using a flash evaporation method, an inkjet process, a screen printing method, or a spin coating method.

20. The method of claim 12, wherein the curing comprises thermal curing or ultraviolet (UV) curing.

* * * * *